United States Patent [19]

McGaffigan

[11] Patent Number: 5,040,717
[45] Date of Patent: Aug. 20, 1991

[54] SOLDER DELIVERY SYSTEM

[75] Inventor: Thomas H. McGaffigan, Half Moon Bay, Calif.

[73] Assignees: Metcal, Inc., Menlo Park, Calif.; AMP Incorporated, Middletown, Pa.

[21] Appl. No.: 499,711

[22] Filed: Mar. 27, 1990

[51] Int. Cl.$^5$ .................... B23K 35/14; H05K 3/34
[52] U.S. Cl. ................................ 228/56.3; 228/248
[58] Field of Search ............. 228/177, 56.3, 6.2, 228/13, 14, 33, 41, 173.2, 180.1, 215, 216, 254, 255; 29/832, 840, 854

[56] References Cited

U.S. PATENT DOCUMENTS

| | | | |
|---|---|---|---|
| 1,399,769 | 12/1921 | Hodgkinson | 228/56.3 |
| 3,396,894 | 8/1968 | Ellis | 228/56 |
| 3,464,617 | 9/1969 | Raynes et al. | 228/56 |
| 3,472,365 | 10/1969 | Tiedema | 228/56.3 |
| 3,719,981 | 3/1973 | Steitz | 29/423.29 |
| 3,750,252 | 8/1973 | Landman | 29/191.6 |
| 3,750,265 | 8/1973 | Cushman | 29/471.3 |
| 3,953,566 | 4/1976 | Gore | 264/288 |
| 4,187,390 | 2/1980 | Gore | 174/102 R |
| 4,256,945 | 3/1981 | Carter et al. | 219/10.75 |
| 4,354,629 | 10/1982 | Grassauer et al. | 228/56 |
| 4,396,140 | 8/1983 | Jaffe et al. | 228/254 |
| 4,684,055 | 8/1987 | Baer et al. | 228/248 |
| 4,712,721 | 12/1987 | Noel et al. | 228/56.3 |
| 4,807,799 | 2/1989 | Myong et al. | 228/56.3 |
| 4,832,255 | 5/1989 | Bickford et al. | 228/254 |

FOREIGN PATENT DOCUMENTS 3608101  9/1987  Fed. Rep. of Germany ..... 228/56.3

OTHER PUBLICATIONS

Computer Design, "Termination System ...", vol. 19; No. 11, p. 108, Nov. 1980.
IBM Technical Disclosure Bulletin, "Polyurethane Solder Preforms"; vol. 12, No. 12, p. 2222, May 1970.

Primary Examiner—Samuel M. Heinrich
Attorney, Agent, or Firm—Burns, Doane, Swecker & Mathis

[57] ABSTRACT

A solder delivery system including a carrier of compliant, dimensionally passive, high-temperature material, the carrier remaining generally dimensionally passive during heating and having a detent therein including fusible material, preferably in the form of a solder paste, positioned therein which is plastically deformable and adhesive-like, the carrier and fusible material together being compliant to conform to objects to be soldered before heating of the system.

28 Claims, 5 Drawing Sheets

SOLDER DELIVERY SYSTEM

BACKGROUND OF THE INVENTION

1. Field of the Invention

The invention relates to a solder delivery system for terminating a plurality of closely spaced conductors.

2. Prior Art

In the past various systems have been developed for simultaneously delivering solder to a number of closely spaced contacts. As the size of electronic devices decreases and the density of component packing increases, the problems of delivery and of bridging the solder between contacts become significant.

U.S. Pat. No. 3,750,252 to Landman discloses the use of a single, continuous piece of solder to simultaneously solder a large number of terminals. The solder wire extends along a terminal strip, and upon heating the solder melts and coalesces on the individual contacts to form independent soldered connections. Unfortunately, a special terminal strip must be provided for each particular set of terminals.

U.S. Pat. No. 3,396,894 to Ellis discloses a plurality of bodies of solder disposed in heat-recoverable cups formed on a sheet of material. When heat is applied to the cups, they recover, the fusible melts, and the recovering cup material forces the solder out into contact with the objects to be soldered. Unfortunately, the size and exact position of the cups must be predetermined since matching the contacts and aligning the sheet with regard to the contacts is critical. In addition, recovery of the sheet can expel solder prematurely, that is, before the object to be soldered has reached the proper temperature to receive the solder.

U.S. Pat. No. 3,719,981 to Steitz discloses a method of applying solder balls which are appropriately spaced on the tacky surface of a pressure sensitized tape. Again, the product is limited by the size and spacing of the solder balls as well as by the requirements for precise alignment of the product.

U.S. Pat. No. 4,712,721 to Noel et al. similarly discloses mechanical means and methods for delivery of solder preforms of various configurations arranged in a myriad of configurations. These devices are similarly limited in application to specific predetermined contact patterns and require precise alignment for functionality.

U.S. Pat. No. 4,354,629 to Grassauer et al. discloses a solder delivery system having a continuous element of solder material disposed between polymeric layers, one of which is provided with window means to control the flow of solder. Although the use of a continuous solder element similar to that disclosed in U.S. Pat. No. 3,750,252 to Landman discussed above has certain advantages in the manufacturing of the solder delivery system itself, nonetheless, the system is likewise limited by its predetermined window size and spacing and by the precision of alignment required for the system.

U.S. Pat. No. 3,750,265 to Cushman discloses a method of preforming a continuous strip of solder to a plurality of leads or terminals. The solder is preformed to be thinner in cross-section in areas between the terminals so that the solder is drawn to the terminals upon application of heat due to the surface tension effect. Unfortunately, the exact spacing of the terminals must be predetermined, and, again, alignment of the preformed solder is critical.

U.S. Pat. No. 3,464,617 to Raynes et al. discloses a length of adhesive coated tape and a length of solder secured to the tape by the adhesive. The tape and solder are used to sweat solder a pipe and fitting together by wrapping the two about the pipe so as to form the solder into an encircling ring around the pipe. The article disclosed contemplates a one-on-one application of the solder to a joint. Unfortunately, it does not contemplate the division of the continuous solder element among a plurality of electrical contacts.

In view of the prior art, it would be advantageous to have a solder delivery system that could be used with a variety of heating methods for simultaneously soldering a plurality of terminations of varying size and spacing wherein alignment of the system is not critical.

SUMMARY OF THE INVENTION

The purpose of the instant invention is to provide a solder delivery system that is inexpensive, simple to fabricate, highly dimensionally compliant, and generally universal in application without requiring precise alignment of the system for the simultaneous termination of a plurality of contacts of varying size and spacing. To accomplish this purpose there is provided a system composed of a carrier of compliant, dimensionally passive, high-temperature material, the carrier having a detent therein, and fusible material positioned within said detent, the fusible material being plastically deformable and adhesive-like, heating of the carrier and fusible material distributing the fusible material.

In one aspect of the invention there is provided a solder delivery system comprising:
- a carrier of compliant, dimensionally passive, high-temperature material, said carrier having a detent therein; and
- a fusible material positioned within said detent, said fusible material being plastically deformable and adhesive-like to be retained within said detent, the carrier and fusible material conforming to objects to be soldered.

In another aspect of the invention there is provided a solder delivery system comprising:
- a carrier of foamed, high-temperature material, said carrier having a detent therein, said carrier remaining generally dimensionally passive during heating; and
- a fusible material positioned within said detent.

In yet another aspect of the invention there is provided a solder delivery system comprising:
- a carrier of compliant, dimensionally passive, high-temperature material, said carrier having a detent therein; and
- a fusible material positioned with said detent, said fusible material having a plurality of fusible particles which can move with respect to each other to conform to objects to be soldered and which regulate the amount of solder that can be drawn from the carrier by particle-to-particle heat transfer.

DESCRIPTION OF THE DRAWING

FIG. 2 is a partial cross-sectional view taken along cross-section lines 2—2 in FIG. 3 of the solder delivery system before, during, and after heating of the system.

DESCRIPTION OF THE PREFERRED EMBODIMENTS

Figure 1:
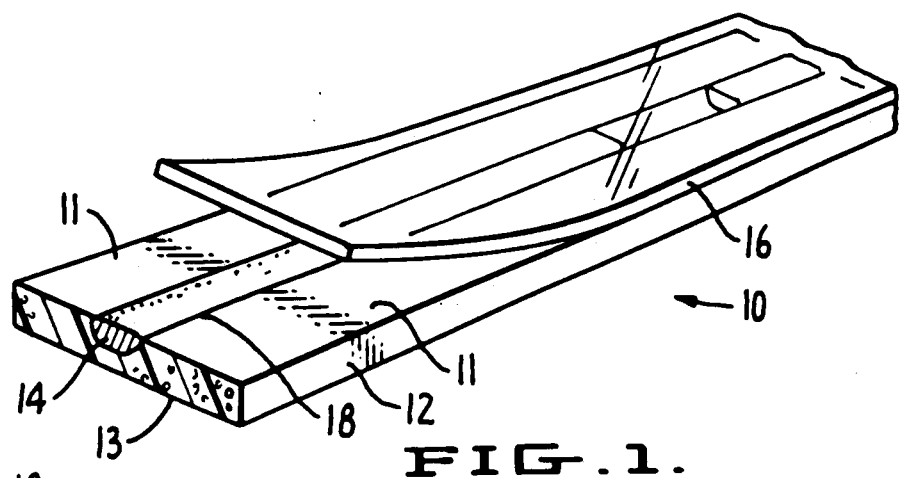
FIG. 1 is a partial perspective view of the solder delivery system of the invention including a removable cover film to protect the fusible material from evaporation.
Figure 11:
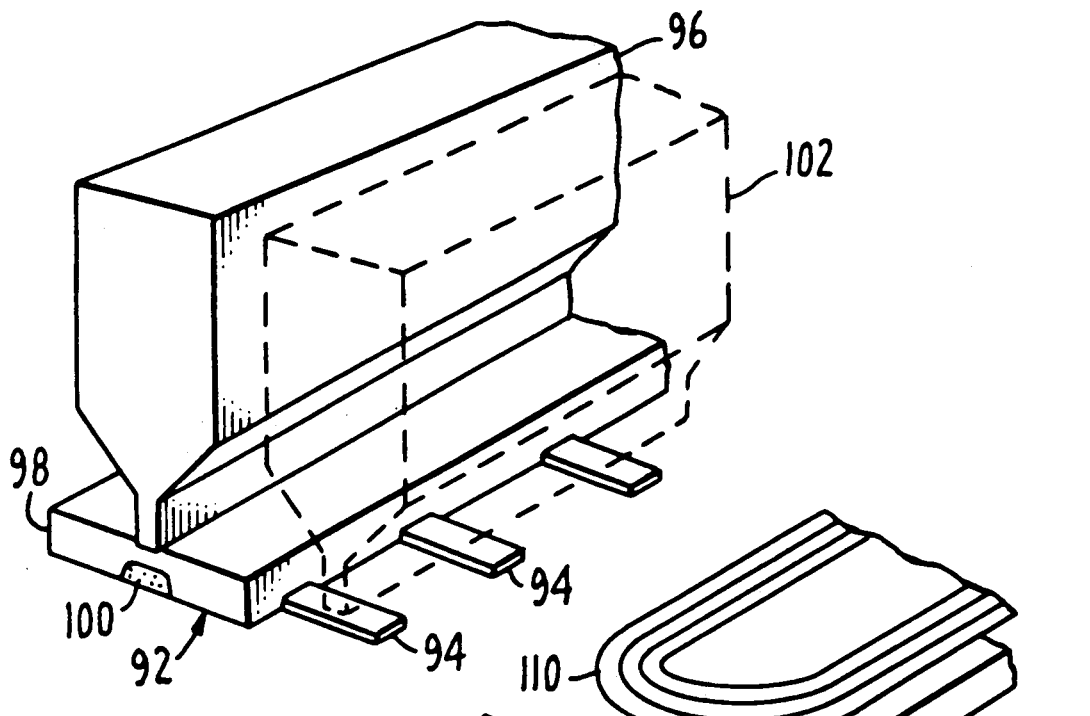
FIG. 11 is a partial perspective view of the solder delivery system of the invention positioned in contact with leads to be soldered including heating means in the form of a hot bar positioned on the carrier and, as shown in phantom line, in the alternative, positioned on the leads to be soldered.

With continued reference to the drawing, FIG. 1 illustrates in partial perspective view the solder delivery system of the invention shown generally at 10. Solder delivery system 10 includes carrier 12 and fusible material 14. FIG. 1 also illustrates optional removable cover film 16 which is intended to protect fusible material 14 from evaporation during storage of solder delivery system 10. Top surface 11 may be coated with a pressure-sensitive adhesive to fixture solder delivery system 10 prior to heating. Additionally, this adhesive may be used to permanently attach carrier 12 to seal and protect the soldered connections. Bottom surface 13 may also be coated with an adhesive in order to attach the solder delivery system to the underside of a hot bar, as shown in FIG. 11.

Carrier 12 is made of a compliant, dimensionally passive, high-temperature material. A preferred material is a tetrafluoroethylene polymer (hereinafter "PTFE") in a porous form. Such materials and the processes for manufacture thereof are described in detail in U.S. Pat. Nos. 3,953,566 and 4,187,390 assigned to W. L. Gore & Associates, Inc., of Newark, Del. These materials have high compliance and high strength.

By way of example, but not limitation, other materials from which carrier 12 can be fabricated are tetrafluoroethylene ("TFE"), fluorinated ethylene propylene ("FEP") and polyimides. These materials are preferably used in the form of a closed cell foam in order to retain volatile components within the fusible material or in an open cell foam with a continuous nonpermeable skin. The carrier may also be made of an open cell foam such as Solimide ® TA-301 Flexible Polyimide Foam available from IMI-TECH Corporation of Elk Grove Village, Ill.

It is understood that other materials which are dimensionally passive upon heating and which are compliant are also considered to be within the scope of the invention. Such preferred materials are unlike conventional non-foamed high temperature polymeric materials (such as Kynar TM ) which generally expand substantially upon heating. In contrast, foamed PTFE is passive during heating and, as will be further described later, is non-intrusive and will slightly withdraw upon heating. The subject invention's carrier does not force fusible material toward objects to be soldered since the materials of the carrier 12 are dimensionally passive and preferably slightly withdraw from the fusible material.

Carrier 12 is shown to have a detent 18 therein, fusible material 14 being positioned within detent 18. Detent 18 is preferably formed with heat and pressure to heat-set the detent into carrier 12. Other mechanical means to form detent 18, such as extrusion, machining, etc. are also within the scope of the invention.

Fusible material 14 is plastically deformable and adhesive-like. Fusible material 14 is preferably a solder paste which includes a flux such that the melting point of the flux is lower than that of the solder component contained therein, thereby allowing the flux to escape from the paste matrix in order to clean the surface to be soldered by the molten solder. Fusible material 14 is preferably a solder paste, but it is within the scope of the invention to use other fusible materials such as conductive adhesives and gels. Suitable conductive adhesives and gels are known in the art. It is understood that a conductive adhesive is considered to be within the meaning of the term "fusible material" for the purposes of this invention. The flux in the paste additionally provides the adhesive mechanism to retain fusible material 14 within detent 18 of carrier 12.

Aside from the conformability of the fusible material, it is important that the fusible material of the invention be comprised of a plurality of particles (in a paste, gel, conductive adhesive, etc.). The plurality of particles allows the fusible material to be regulated with regard to the amount of fusible material that can be drawn from the carrier. This regulatory effect is due to particle-to-particle heat transfer in contrast to the heat transfer of a solid fusible material. Thus, the heat transferred through the fusible material is limited to the amount of fusible material in thermal proximity to the heated object.

Most importantly, carrier 12 and fusible material 14 are both flexible and deformable, i.e., they have similar physical properties such that the solder delivery system can be characterized as being compliant. The result is a solder delivery system that is bendable and compressible wherein carrier 12 retains fusible material 14 in the immediate vicinity where it is required and wherein carrier 12, because of its dimensional stability, remains passive during heating of the system so as not to force fusible material 14 toward an unwilling surface until the temperature of the surface is high enough to melt the flux contained within fusible material 14 and then allowing wetting by the solder contained within fusible material 14.

FIG. 1 illustrates cover film 16 which keeps fusible material 14 viscous by retaining volatile solvents that may be present in the flux of the fusible material. In lieu of cover film 16, it is within the scope of the invention to seal solder delivery system 10 within a plastic bag, or the like, to keep the system compliant.

Figure 5:
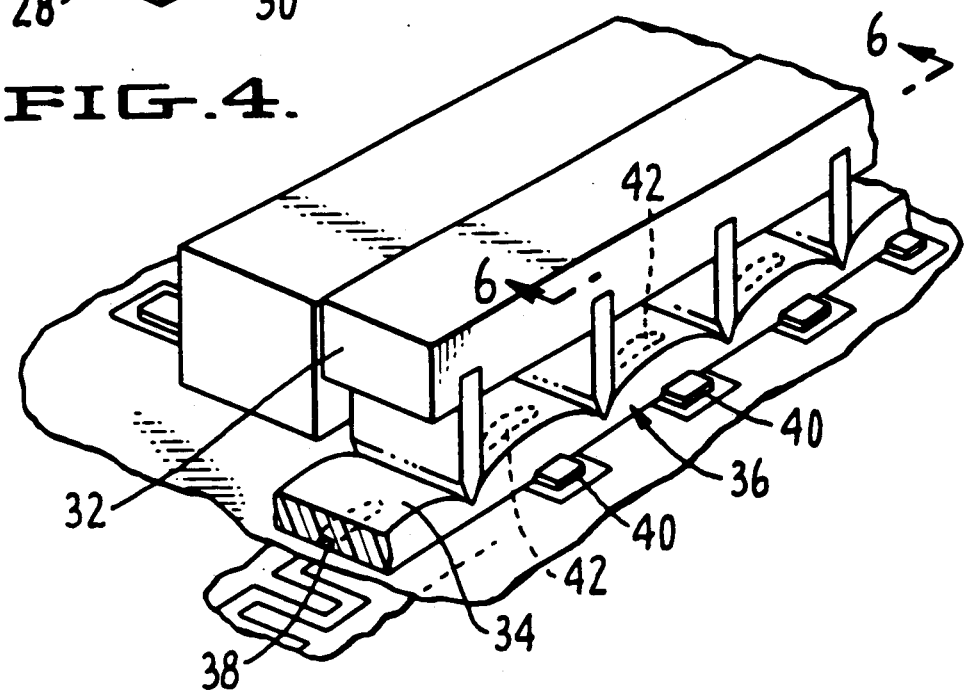
FIG. 5 is a partial perspective view similar to FIG. 3 further including dividing means to apply pressure to the back side of the solder delivery system, thereby concentrating the fusible material around objects to be soldered prior to the application of heat to the system.

Premature evaporation of the volatile solvents of the fusible material 14 will not destroy the solder delivery system, but it will compromise the system's ability to be used with a dividing means, as shown and discussed with regard to FIG. 5. It is understood that even dried fusible material is plastically deformable and adhesive-like within the meaning of fusible material according to the subject invention.

Figure 2A:
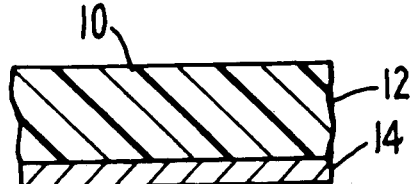
FIG. 2A illustrates the system before application of heat, the system being positioned over a typical lead that is to be soldered to a typical trace of an electronic circuit.
Figure 2B:
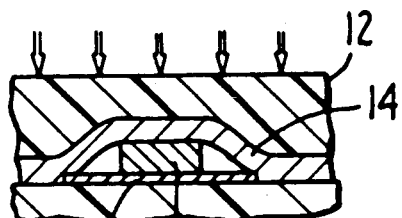
FIG. 2B illustrates the system pressed over the lead, the carrier and fusible material of the system dimensionally conforming to the lead and trace just prior to application of heat to the system.
Figure 2C:
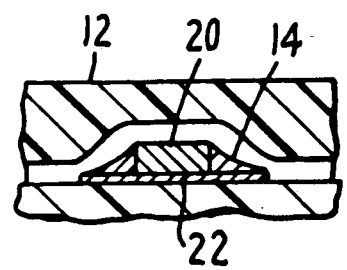
FIG. 2C illustrates the system after application of heat wherein the fusible material has flowed to the lead and trace, thus soldering the two to each other and creating fillets of solder. The Figure illustrates the withdrawal of the dimensionally passive carrier upon heating, thereby leaving an empty image of the area previously occupied by the fusible material.
Figure 3:
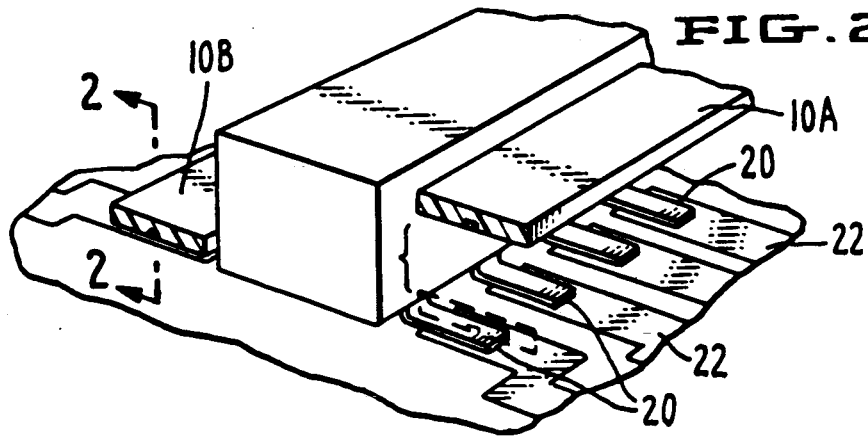
FIG. 3 is a partial perspective view of an electronic component having multiple leads which are to be soldered to traces of flexible circuitry. The solder delivery system of the invention is shown spaced above objects to be soldered on the right-hand side of the Figure and is in contact with such objects on the left-hand side of the Figure.

FIG. 2 is a partial cross-sectional view taken along cross-section lines 2—2 in FIG. 3 illustrating the solder delivery system before, during, and after heating of the system. In FIG. 3, solder delivery system 10A is shown positioned above components to be fused. On the left side of the Figure, solder delivery system 10B is in contact with such components to be fused illustrating how the solder delivery system would be positioned prior to the application of heat. It is understood that cover film 16 has been removed, and the solder delivery system has been turned over to position fusible material 14 against the components to be interconnected.

In FIGS. 2A—C, electrical lead 20 to be fused to electrical trace 22 is present on the surface of a printed circuit. In FIG. 2A, solder delivery system 10 is shown to rest on top of electrical lead 20. It is understood that fusible material 14 extends longitudinally across a plurality of similar leads 20.

In FIG. 2B, pressure is applied to the back of solder delivery system 10 to force the compliant solder delivery system into intimate contact with lead 20, trace 22, and the substrate which supports them. It can be seen that carrier 12 and fusible material 14 conform to the geometric configuration of lead 20 and trace 22.

FIG. 2C shows the solder delivery system after the application of heat wherein fusible material 14 has flowed to solder lead 20 to trace 22. It is important to note that fusible material 14 has flowed away from carrier 12, carrier 12 being dimensionally passive during the application of heat. In the case of the preferred carrier material, carrier 12 slightly withdraws and retreats from the heated surfaces leaving, as can be seen in FIG. 2C, leaving an image of the area previously occupied by fusible material 14. In contrast to prior art devices in which carrier 12 is non-conformal and/or expands upon heating to force fusible material 14 toward components to be connected, carrier 12 of the subject invention remains dimensionally passive under high temperature. The dimensionally passive nature of carrier 12 allows the flux contained within fusible material 14 to flow out of the fusible material 14 embedded in detent 18 in carrier 12, the flux preparing the surfaces to be connected. Solder is then drawn by the elevated temperature of the components to wet and solder them together.

Figure 4:
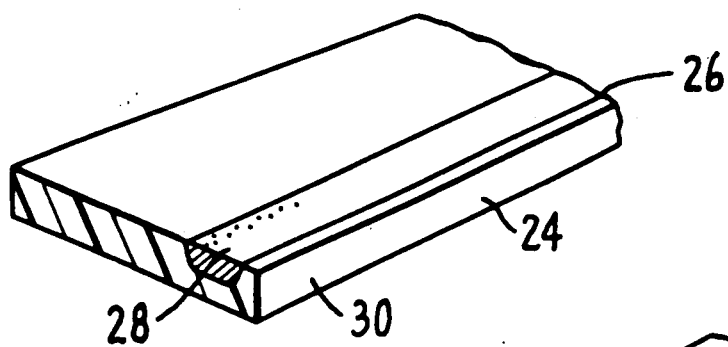
FIG. 4 illustrates an alternate embodiment of the solder delivery system shown in FIG. 1 wherein the fusible material is positioned proximate to the edge of the carrier to place the fusible material contained therein adjacent an object to be soldered.

In FIG. 1, carrier 12 is a tape, preferably made from the expanded foam of PTFE, and detent 18 and fusible material 14 positioned therein are distant from the edges of the tape. In contrast, FIG. 4 illustrates tape 24 having a detent 26 and fusible material 28 contained therein positioned proximate to the edge 30 of the tape. When the solder delivery system illustrated in FIG. 4 is turned over and positioned in contact with components to be interconnected, fusible material 28 can be positioned close to an obstruction such as the body of an electronic component.

FIG. 5 is a partial perspective view similar to FIG. 3 including dividing means 32 of the invention which applies pressure to the back side 34 of the solder delivery system shown generally at 36 which has been in contact with components to be soldered. Dividing means 32 is capable of concentrating fusible material 38 contained within solder delivery system 36 over leads 40 to be soldered prior to the application of heat to the system. In addition, the dividing means positively fixtures the leads 40 and seals areas 41 to prevent solder from bridging between leads 40.

Figure 6:
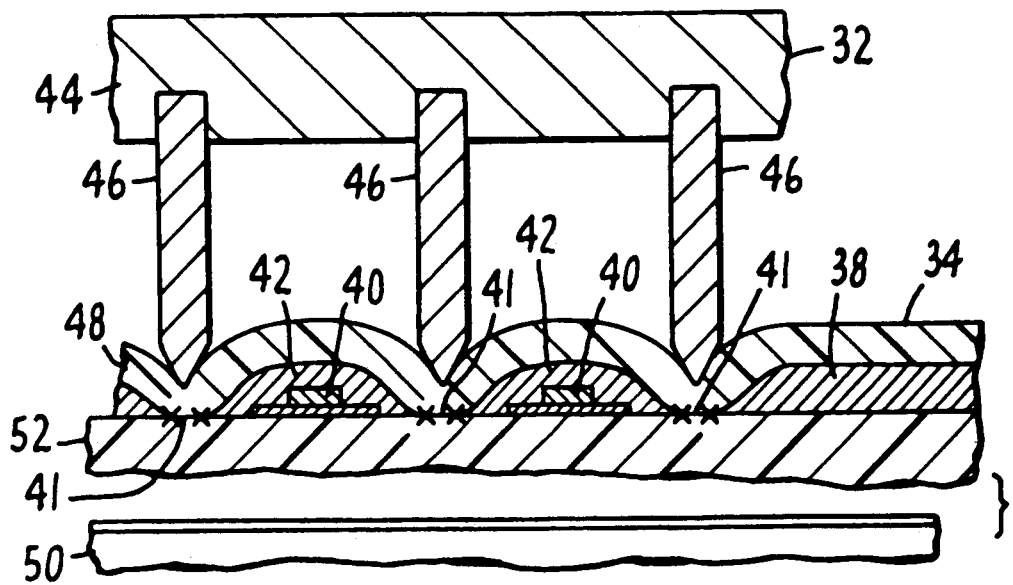
FIG. 6 is a partial cross-sectional view taken along section lines 6—6 in FIG. 5 illustrating the dividing means which has separated the fusible material which is in the form of a solder paste. The Figure also illustrates the placement of a heating means below the flexible circuitry to show one possible method of heating the area to be soldered.

FIG. 6 is a partial cross-sectional view taken along section lines 6—6 in FIG. 5 showing dividing means 32 which has separated fusible material 38 into pockets 42 of fusible material. Dividing means 32 is shown to have a base 44 and a plurality of blade-like members 46 which are capable of concentrating force applied to base 44 onto specific areas of the back side 34 of solder delivery system 36 before the application of heat thereto. Solder delivery system 36 includes carrier 48 having a detent therein and fusible material 38 (preferably in the form of a solder paste) positioned within the detent. It can be seen that the concentration of force to the back side 34 of carrier 48 causes solder delivery system 36 to conform to the objects to be soldered, thus squeezing fusible material 38 away from the areas of high pressure concentration toward objects 40 to be soldered. It is understood that various configurations of dividing means may be used to force the deformable fusible material into almost any desired shape.

Figure 10:
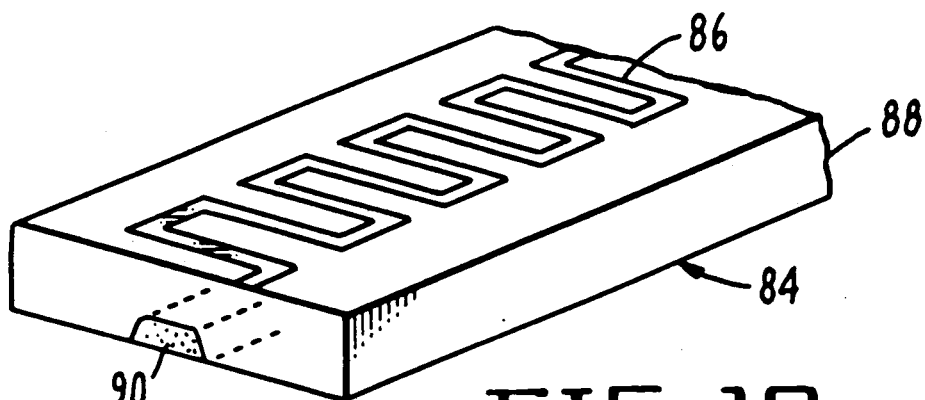
FIG. 10 is a partial perspective view of an alternate solder delivery system of the invention including heating means illustrated to be integral with the carrier.

FIG. 6 also illustrates the placement of a separate heating means 50 below flexible circuitry 52 as one way of heating the area to be soldered. It is within the scope of the invention to use alternative heating means which can be positioned adjacent the fusible material by either being integral with the carrier or being placed on top of the carrier, such as seen in FIG. 10, as will be discussed later. Other heating means will also be discussed with regard to FIGS. 11 and 12.

Figure 7:
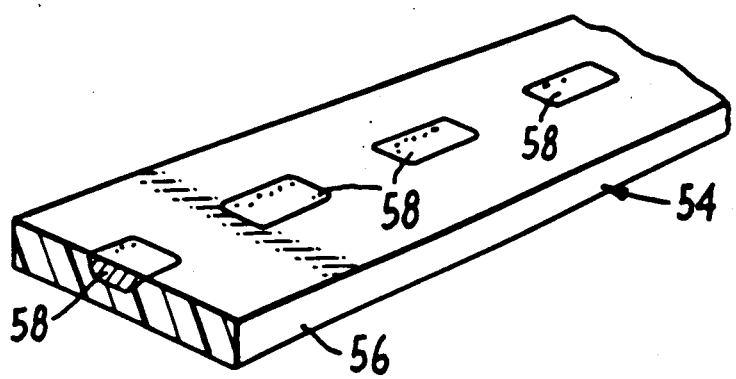
FIG. 7 is an alternate embodiment of the solder delivery system of the invention wherein the carrier detent is discontinuous.

FIG. 7 is an alternate embodiment of solder delivery system 54 having a carrier 56 and fusible material 58 which is positioned within a detent which is discontinuous. In FIGS. 5 and 6, an external dividing means 32 can be used to separate the fusible material, preferably in the form of a solder paste, to concentrate the fusible material where desired. In FIG. 7, carrier 56 has been preformed such that the detent in carrier 56 comprises a series of depressions in which fusible material 58 is positioned. Solder delivery system 54 is particularly useful in situations wherein a complex geometric pattern of components to be soldered can be predetermined and/or wherein the components to be connected are spaced very close to each other. Solder delivery system 54 allows delivery of the fusible material which is conformable without the risk of the bridging of solder versus the delivery of discrete pieces of hard solder as taught in the prior art. The plastically deformable fusible material can thus be positioned and "squeezed" by pressure applied to carrier 56 into relatively inaccessible interstices. Solder delivery system 54 is useful where dividing means 32 shown in FIGS. 5 and 6 cannot practically be used. It is understood that the pattern of detent depressions can be varied as desired and need not be aligned.

Figure 8:
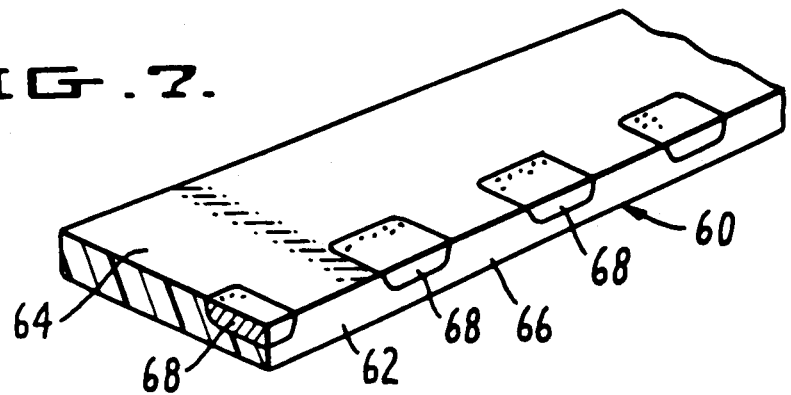
FIG. 8 is yet another embodiment of the solder delivery system of the invention similar to FIG. 7 wherein the discontinuous detent is positioned adjacent one edge of the carrier, thereby allowing the fusible material to flow in at least two directions from the carrier.

FIG. 8 is yet another embodiment of a solder delivery system 60 wherein carrier 62 is likewise a tape having multiple surfaces, i.e., 64 and 66, and wherein the detent in carrier 62 comprises a series of depressions containing fusible material 68, at least one of the depressions opening to two surfaces of the tape, 64 and 66. The two-sided openings for fusible material 68 allow fusible material 68 to easily flow toward components to be soldered upon heating. Combinations of delivery through multiple surfaces and/or openings (see FIG. 9) are considered to be within the scope of the subject invention.

Figure 9:
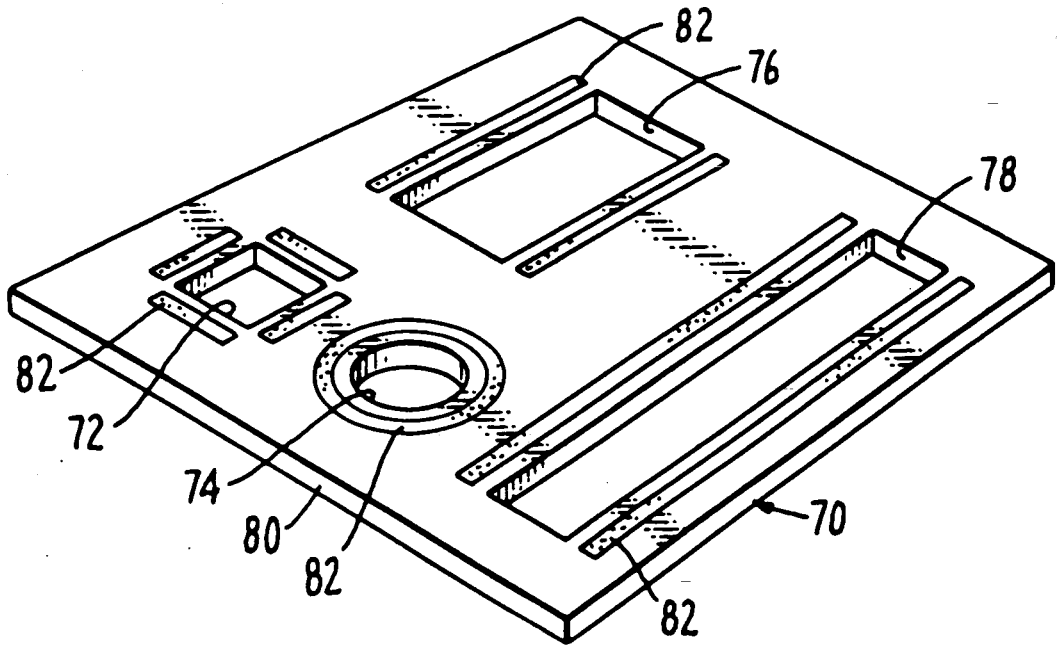
FIG. 9 illustrates the solder delivery system of the invention further including openings in the carrier to accommodate typical electronic components, the detents being positioned adjacent the openings.

FIG. 9 illustrates a solder delivery system shown generally at 70 which includes openings 72, 74, 76, and 78 in carrier 80 to accommodate typical electronic components, carrier 80 having detents containing fusible material 82, the detents varying in position and dimension and being continuous or discontinuous, as desired.

FIG. 10 is a partial perspective view of an alternate solder delivery system shown generally at 84 including heating means 86 illustrated to be integral with carrier 88. It is within the scope of the invention, as discussed earlier, to include a heating means which can be positioned on or within the carrier to heat fusible material 90 contained therein. Heating means 86 is shown to be a resistance-type heater which elevates in temperature when current is passed therethrough. It is within the scope of the invention to use other forms of heating means which are either self-regulated or remote-controlled, as is well known in the art.

FIG. 11 illustrates a solder delivery system shown generally at 92 positioned over leads 94 to be soldered, and further including heating means in the form of hot bar 96 which is positioned over carrier 98, carrier 98 being proximate to fusible material 100. Hot bar 96 heats fusible material 100 to an elevated temperature. It is understood that such a hot bar 96 may be placed elsewhere, as desired. For example, it may be positioned above leads 94 to be soldered, as shown in phantom line 102. In this embodiment the fusible material is heated from the heat transferred up lead 94 to the fusible material 100.

Figure 12:
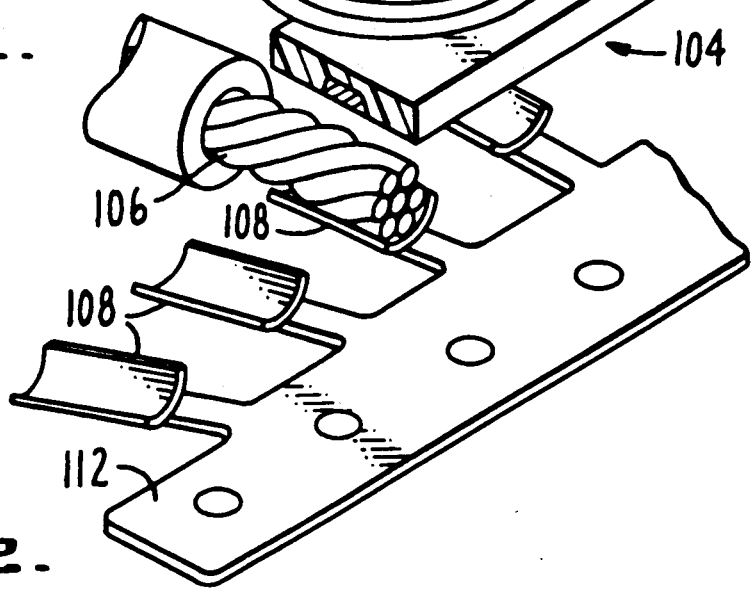
FIG. 12, is a partial perspective exploded view of the solder delivery system of the invention positioned above a wire to be soldered including heating means in the form of a self-regulating heater material which may be heated by magnetic flux produced by induction coil, which is also shown in the Figure.

FIG. 12 is a partial perspective exploded view of a solder delivery system shown generally at 104 positioned over wire 106 to be soldered including heating means comprising in part a separate piece 108 formed of self-regulating heater material which is heated by the magnetic flux produced by induction coil 110. Various types of self-regulating heater material are well known in the art. See, for example, U.S. Pat. No. 4,256,945 to Carter et al. In the alternative, solder delivery system 104 and wire 106 may be heated directly by passing current through carrier strip 112.

Figure 13:
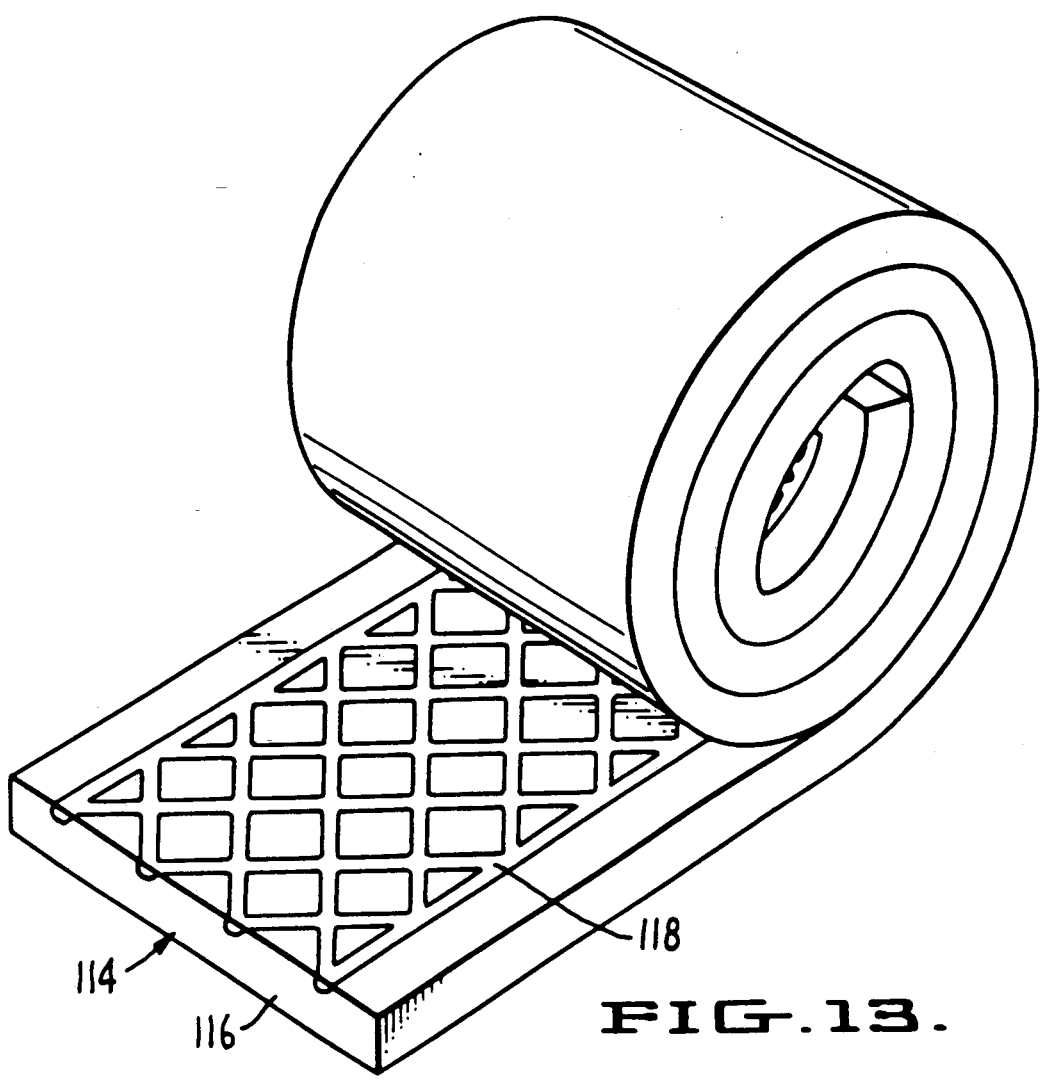
FIG. 13 is a partial perspective view of an alternate embodiment of the solder delivery system wherein the detent of the carrier is an open grid-like structure filled with fusible material, the carrier being shown to be partially rolled in spiral-like fashion such that the fusible material is protected from the environment and from evaporation during storage.

FIG. 13 is a partial perspective view of yet another embodiment of the solder delivery system shown generally at 114 wherein the detent in carrier 116 is an open grid-like structure filled with fusible material 118. Carrier 116 is shown to be partially rolled in spiral-like fashion such that fusible material 118 is protected from the environment and from evaporation during storage. Solder delivery system 114 is especially useful in situations wherein the electrical shield layer of a cable is to be terminated to a connector and/or wherein such a braided shield is patched. Solder delivery system 114 can deliver a large amount of fusible material 118.

Figure 14:
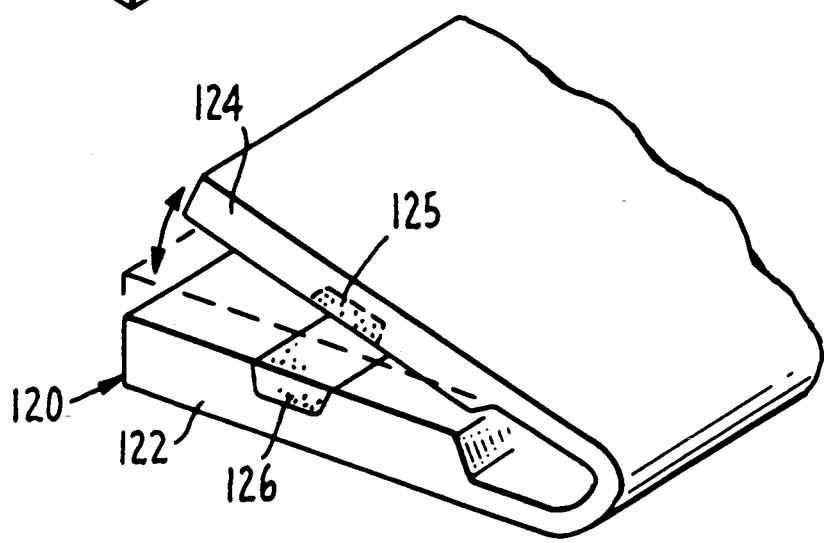
FIG. 14 is a partial perspective view of yet another embodiment of the solder delivery system wherein the carrier includes a portion thereof that is foldable over the fusible material to protect the material from evaporation during storage, the foldable portion being capable of being transferred away during application of the fusible material to an object to be soldered. Shown in phantom is an additional detent with the fusible material in the foldable portion thus enabling the fusible material to be delivered to both sides of a circuit board simultaneously.

FIG. 14 is a partial perspective view of yet another embodiment of a solder delivery system shown generally at 120 wherein carrier 122 includes a portion 124 thereof that is foldable over fusible material 126 to protect the material during storage from evaporation. Foldable portion 124 is capable of being opened out (unfolded), as shown by the direction arrows, for the application of fusible material 126 to an object to be soldered. If desired, fusible material 125 (shown in phantom) can also be embedded in portion 124 so that both top and bottom can simultaneously solder both sides of a printed circuit board that may be positioned therebetween.

With all of the above-discussed embodiments, it is within the scope of the invention to include adhesive material to secure the carrier before and during application of heat. It is also within the scope of the invention to have the carrier remain in secured position after the application of heat to provide an environmental seal, if desired.

From the foregoing detailed description of several embodiments of this invention, it is evident that there may be a number of changes, adaptations, and modifications which come within the province of those skilled in the art. However, it is intended that all such variations not departing from the spirit of the invention should be considered to be within the scope thereof as limited solely by the appended claims.

I claim:

1. A solder delivery system comprising:

a carrier of compliant, dimensionally passive, high-temperature material, said material being an expanded foam of a PTFE type material, said carrier having at least one surface and having a detent in said surface, said detent extending only partially into said surface; and a fusible material positioned within said detent, said fusible material being plastically deformable and adhesive-like to be retained within said detent, said fusible material being a solder paste type of material, said carrier and fusible material conforming to objects to be soldered.

2. A system as in claim 1 wherein said detent and fusible material are distant from the edges of said tape.

3. A system as in claim 1 wherein said detent and fusible material are positioned proximate to an edge of said carrier.

4. A system as in claim 2 wherein said detent comprises a series of depressions.

5. A system as in claim 3 wherein said carrier has multiple surfaces and said detent comprises a series of depressions, at least one of said depressions opening to two surfaces of said carrier.

6. A system as in claim 1 wherein said carrier has openings therethrough and said detent is positioned adjacent said openings.

7. A system as in claim 1 wherein said carrier is an open cell foam.

8. A system as in claim 1 wherein said carrier is a polyimide open cell foam.

9. A solder delivery system comprising:
a carrier of compliant, dimensionally passive, high-temperature material, said carrier having at least one surface and having a detent in said surface, aid detent extending only partially into said surface;

a fusible material positioned within said detent, said fusible material being plastically deformable and adhesive-like to be retained within said detent, the carrier and fusible material conforming to objects to be soldered; and dividing means, said dividing means capable of contacting said carrier to force said fusible material into a plurality of discrete quantities of fusible material sealed from each other upon application of pressure to said dividing means.

10. A solder delivery system comprising:
a carrier of compliant, dimensionally passive, high-temperature material, said carrier having at least one surface and having a detent in said surface extending only partially into said surface; and a fusible material positioned within said detent, said fusible material being plastically deformable and adhesive-like to be retained within said detent, said fusible material being a conductive adhesive, said carrier and fusible material conforming to objects to be soldered.

11. A solder delivery system comprising:
a carrier of compliant, dimensionally passive, high-temperature material, said carrier having at least one surface and having a detent in said surface extending only partially into said surface of said carrier; and a fusible material positioned within said detent, said fusible material being plastically deformable and adhesive-like to be retained within said detent, said fusible material being a gel, said carrier and fusible material conforming to objects to be soldered.

12. A solder delivery system comprising:

a carrier of foamed, high-temperature material, said carrier having a detent therein, said carrier remaining generally dimensionally passive during heating; and a fusible material positioned within said detent, said fusible material being a solder paste including flux, said flux providing an adhesive mechanism to retain said solder paste within said detent of said carrier upon deformation of said carrier and said solder paste.

13. A system as in claim 12 wherein the material of said carrier is PTFE type material.

14. A system as in claim 12 wherein the material of said carrier withdraws slightly upon heating, thereby increasing the dimensions of said detent and thus withdrawing said carrier from a fused object.

15. A system as in claim 12 further including heating means positioned adjacent said fusible material.

16. A system as in claim 15 wherein said heating means comprises a resistance heater connected to said carrier.

17. A system as in claim 12 wherein said detent is an open grid-like network.

18. A system as in claim 17 wherein said carrier can be rolled upon itself in spiral-like fashion protecting said solder paste from evaporation during storage.

19. A system as in claim 12 wherein said carrier includes a portion thereof that folds over said detent and fusible material to protect the fusible material from evaporation, said portion capable of being unfolded, thereby exposing said fusible material for contact with an object to be soldered.

20. A solder delivery system comprising:
a carrier of foamed, high-temperature material, said carrier having a detent therein, said carrier remaining generally dimensionally passive during heating;
a fusible material positioned within said detent; and
heating means positioned adjacent said fusible material, said heating means including an induction coil and further including contacts of self-regulating heater material, said contacts positioned proximate to said fusible material and objects to e soldered.

21. A solder delivery system comprising:
a carrier of foamed, high-temperature material, said carrier having a detent therein, said carrier remaining generally dimensionally passive during heating;
a fusible material positioned within said detent; and
a cover film protecting said fusible material from evaporation, said cover film being removable before application of the system to an object to be soldered.

22. A solder delivery system comprising:
a carrier of compliant, dimensionally passive, high-temperature material, said material being an open cell foam, said carrier having at least one surface and having a detent therein, said detent extending only partially into said surface; and
a fusible material positioned within said detent, said fusible material having a plurality of fusible particles which can move with respect to each other to conform to objects to be soldered and which regulate the amount of solder that can be drawn from the carrier by particle-to-particle heat transfer.

23. A system as in claim 22 wherein said carrier is an open cell polyimide foam.

24. A system as in claim 22 wherein the material of said carrier withdraws slightly upon heating, thereby increasing the dimensions of said detent while withdrawing said carrier from a fused object.

25. A system as in claim 22 wherein said fusible material is a solder paste including flux, said flux providing an adhesive mechanism to retain said solder paste within the detent of said carrier upon deformation of said carrier and said solder paste.

26. A system as in claim 22 further including heating means positioned adjacent said fusible material.

27. A system as in claim 26 wherein said heating means comprises a resistance heater connected to said carrier.

28. A system as in claim 26 wherein said heating means includes an induction coil and further including contacts of self-regulating heater materials, said contacts positioned adjacent said fusible materials and objects to be soldered.

* * * * *

UNITED STATES PATENT AND TRADEMARK OFFICE
CERTIFICATE OF CORRECTION

PATENT NO. : 5,040,717
DATED : August 20, 1991
INVENTOR(S) : Thomas H. McGaffigan It is certified that error appears in the above-identified patent and that said Letters Patent is hereby corrected as shown below:

Column 3, line 59, delete "," after Fig. 12.

Column 6, line 23, delete "leaving".

Column 9, line 34, "aid" should be --said--.

Column 10, line 43, "e" should be --be--.

Signed and Sealed this

Twenty-ninth Day of December, 1992

*Attest:*

DOUGLAS B. COMER

*Attesting Officer*   *Acting Commissioner of Patents and Trademarks*